United States Patent
Schulze et al.

(10) Patent No.: US 9,496,337 B2
(45) Date of Patent: Nov. 15, 2016

(54) METHOD FOR PRODUCING A SEMICONDUCTOR DEVICE HAVING A BEVELED EDGE TERMINATION

(71) Applicant: Infineon Technologies Austria AG, Villach (AT)

(72) Inventors: Hans-Joachim Schulze, Taufkirchen (DE); Anton Mauder, Kolbermoor (DE); Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 230 days.

(21) Appl. No.: 14/134,318

(22) Filed: Dec. 19, 2013

(65) Prior Publication Data

US 2015/0179737 A1   Jun. 25, 2015

(51) Int. Cl.
*H01L 29/02* (2006.01)
*H01L 29/06* (2006.01)
*H01L 21/3065* (2006.01)
*H01L 21/324* (2006.01)
*H01L 21/78* (2006.01)
*H01L 21/302* (2006.01)

(52) U.S. Cl.
CPC ......... *H01L 29/0661* (2013.01); *H01L 21/302* (2013.01); *H01L 21/3065* (2013.01); *H01L 21/30655* (2013.01); *H01L 21/324* (2013.01); *H01L 21/3247* (2013.01); *H01L 21/78* (2013.01)

(58) Field of Classification Search
CPC .......... H01L 21/78; B81C 2201/0116
USPC ......................................................... 257/496
See application file for complete search history.

(56) References Cited

U.S. PATENT DOCUMENTS

| | | | | |
|---|---|---|---|---|
| 7,867,879 B2* | 1/2011 | Weber | ..................... | H01L 21/78 257/E21.237 |
| 2005/0202651 A1* | 9/2005 | Akram | ................. | B23K 26/367 438/463 |
| 2006/0131651 A1* | 6/2006 | Sato | ....................... | B82Y 20/00 257/347 |
| 2007/0190743 A1* | 8/2007 | Colombo | .......... | H01L 21/76281 438/424 |
| 2009/0189257 A1* | 7/2009 | Seki | .................... | H01L 29/0603 257/626 |
| 2010/0032764 A1* | 2/2010 | Andry | ............... | H01L 21/76898 257/369 |
| 2011/0204488 A1* | 8/2011 | Itou | ........................ | H01L 21/78 257/622 |
| 2012/0315738 A1* | 12/2012 | Kobayashi | ........ | H01L 21/76898 438/424 |
| 2013/0134530 A1* | 5/2013 | Kautzsch | ............ | B81C 1/00158 257/417 |

* cited by examiner

*Primary Examiner* — Andy Huynh
*Assistant Examiner* — Sitaramarao S Yechuri
(74) *Attorney, Agent, or Firm* — Murphy, Bilak & Homiller, PLLC

(57) ABSTRACT

A method for producing a semiconductor device includes forming a trench that defines a closed loop in a semiconductor body and extends from a first surface into the semiconductor body. The trench has at least one sidewall that is beveled relative to a vertical direction of the semiconductor body. The method further includes removing material of the semiconductor body at least between a bottom of the trench a second surface opposite the first surface of the semiconductor body.

19 Claims, 15 Drawing Sheets

METHOD FOR PRODUCING A SEMICONDUCTOR DEVICE HAVING A BEVELED EDGE TERMINATION

TECHNICAL FIELD

The present disclosure relates to a method for producing a semiconductor device, in particular a method for producing a semiconductor device having a beveled edge termination.

BACKGROUND

Power semiconductor devices, such as power diodes, power MOSFETs (Metal Oxide Field-Effect Transistors), power IGBTs (Insulated Gate Bipolar Transistors) or power thyristors, are designed to withstand high blocking voltages. Those power devices include a pn-junction that is formed between a p-doped semiconductor region and an n-doped semiconductor region. The device blocks—or is switched off—when the pn-junction is reverse biased. In this case, a depletion region (space charge region) propagates in the p-doped and n-doped regions. Usually one of these semiconductor regions is more lightly doped than the other one of the semiconductor regions, so that the depletion region mainly extends in the more lightly doped region, which mainly supports the voltage applied across the pn-junction. The semiconductor region supporting the blocking voltage is referred to as base region in a diode or thyristor, and is referred to as drift zone in an MOSFET or IGBT.

The ability of a pn-junction to support high voltages is limited by the avalanche breakdown phenomenon. As a voltage applied across a pn-junction increases, an electric field in the semiconductor regions forming the pn-junction increases. The electric field results in acceleration of mobile carriers present in the semiconductor region. An avalanche breakdown occurs when, due to the electric field, the charge carriers are accelerated such that they create electron-hole pairs by impact ionization. Charge carriers created by impact ionization create new charge carriers, so that there is a multiplication effect. At the onset of avalanche breakdown, a significant current flows across the pn-junction in the reverse direction. The voltage at which the avalanche breakdown sets in is referred to as breakdown voltage.

The electric field at which the avalanche breakdown sets in is referred to as critical electric field. The absolute value of the critical electric field is mainly dependent on the type of semiconductor material used to form the pn-junction, and is weakly dependent on the doping concentration of the more lightly doped semiconductor region.

The critical electric field is a theoretical value that is defined for a semiconductor region that has an infinite size in directions perpendicular to field strength vectors of the electric field. Power semiconductor components, however, have semiconductor bodies of finite size that are terminated by edge surfaces in lateral directions. For different reasons, such as imperfections of the crystal lattice at the edge surfaces, or geometrical effects leading to crowding of the electric field, the breakdown voltage of the component is lower in edge regions that are close to the edge surfaces than in inner regions that are distant to the edge surface. In order to compensate for the reduced breakdown voltage in the edge regions edge terminations are known that serve to reduce the electric held in edge regions as compared to the inner regions or at least reduce the effect of electric field crowding.

Different types of edge terminations are known, such as vertical edge terminations (mesa edge terminations), or beveled edge terminations. Beveled edge terminations have edge surfaces that are beveled.

Several methods for producing beveled edge terminations are known. Those methods include, for example, grinding, lapping, polishing or sandblasting an edge region of a round semiconductor body in order to form beveled edge surfaces. The quality of the resulting surfaces may be improved by implementing a subsequent etching process. However, a round semiconductor body may not be convenient for some types of semiconductor devices. Further, these methods either require that only one semiconductor device is integrated in a semiconductor wafer which is then processed in order to form the edge termination, or that the semiconductor wafer is subdivided into a plurality of semiconductor bodies (dies, chips) which are then processed in order to form the edge termination. However, handling small semiconductor bodies in one of the processes explained before may be difficult.

There is therefore a need to provide an improved method for forming a beveled edge termination of a semiconductor device.

SUMMARY

One embodiment of a method for producing a semiconductor device includes forming a trench that defines a closed loop in a semiconductor body and extends from a first surface into the semiconductor body, the trench having at least one sidewall that is beveled relative to a vertical direction of the semiconductor body; and reducing a thickness of the semiconductor body beginning at a second surface, opposite to the first surface, until a semiconductor material between the second surface and the trench is removed.

A further embodiment relates to a semiconductor device. The semiconductor device includes a semiconductor body, and at least one void in the semiconductor body, wherein the void includes at least one sidewall that is beveled relative to a vertical direction of the semiconductor body.

BRIEF DESCRIPTION OF THE DRAWINGS

Examples are explained with reference to drawings. The drawings serve to illustrate the basic principle, so that only aspects necessary for understanding the basic principle are illustrated. The drawings are not to scale. In the drawings the same reference characters denote like features.

FIG. 2, including

FIG. 5, including

FIG. 6, including

DETAILED DESCRIPTION

In the following detailed description, reference is made to the accompanying drawings, which form a part thereof, and in which are shown by way of illustration specific embodiments in which the invention may be practiced. It is to be understood that the features of the various exemplary embodiments described herein may be combined with each other, unless specifically noted otherwise.

Figure 1A:
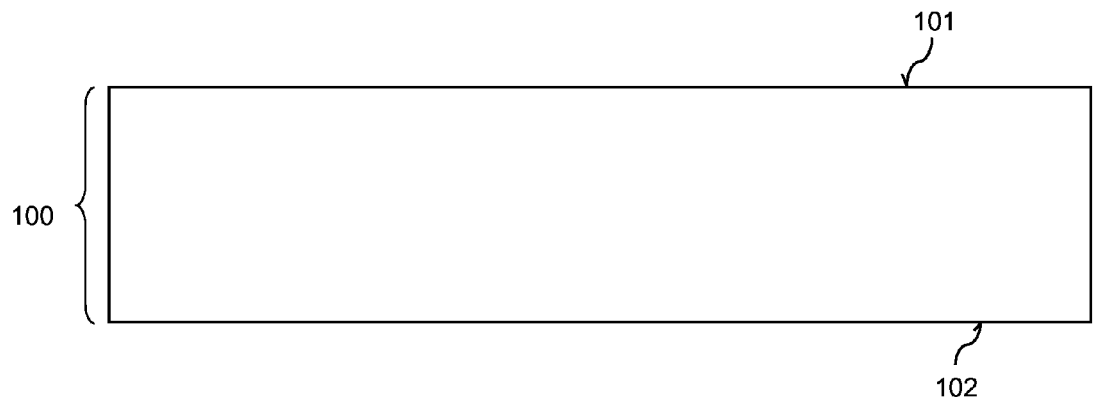
FIGS. 1A-1O, illustrates vertical cross-sectional views of a semiconductor body for illustrating an embodiment of a method for producing a semiconductor device.
Figure 1B:
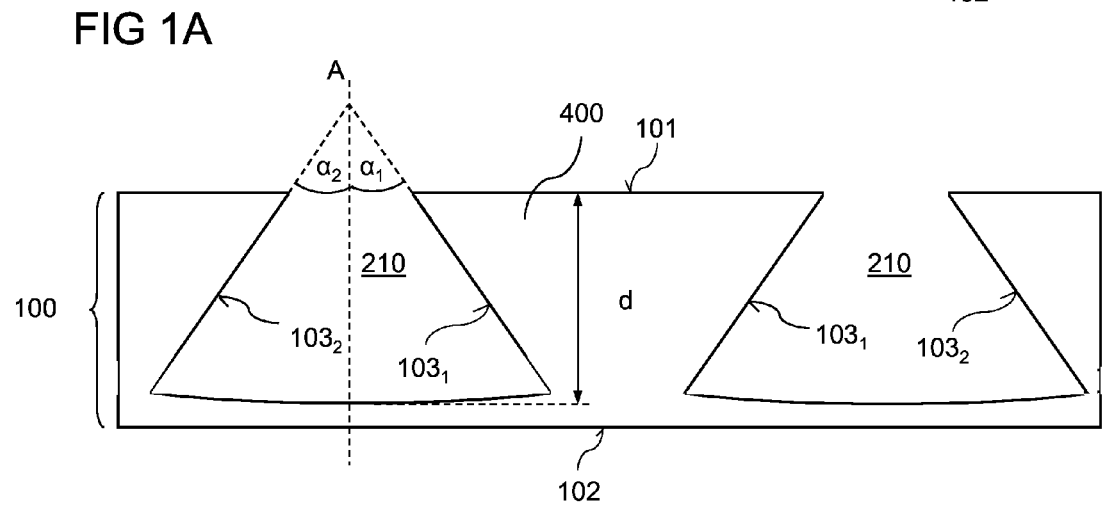
FIG. 1, including
Figure 1C:
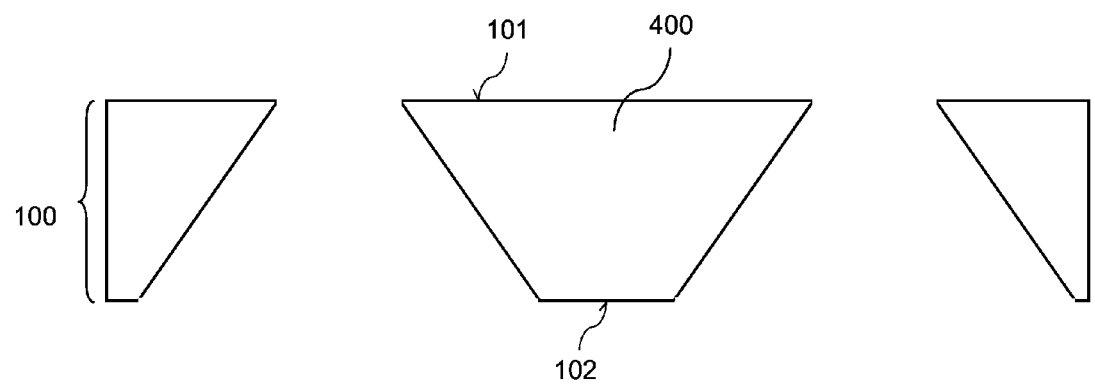

FIGS. 1A-1C illustrate an example of a method for producing a semiconductor device with a beveled edge termination structure. Referring to FIG. 1A, the method includes providing a semiconductor body 100. The semiconductor body 100 may be a wafer or part of a wafer, for example. The semiconductor body 100 has a first surface 101, and a second surface 102 opposite the first surface 101. The semiconductor body 100 may include a conventional semiconductor material, such as silicon (Si), silicon carbide (SiC), gallium arsenide (GaAs), gallium nitride (GaN), or the like. FIGS. 1A-1C show vertical cross sections of the semiconductor body 100 in a section plane that is perpendicular to the first and second surfaces 101, 102 of the semiconductor body.

Referring to FIG. 1B, a trench 210 is formed in the semiconductor body 100. The trench 210 extends in a vertical direction from the first surface 101 into the semiconductor body 100. The trench 210 has a first sidewall 103$_1$, and a second sidewall 103$_2$. Referring to FIG. 1B, the first sidewall 103$_1$ and the second sidewall 103$_2$ are both beveled relative to a vertical direction of the semiconductor body 100. In the embodiment shown in FIG. 1B, there is a first angle $\alpha_1$ between the first sidewall 103$_1$ and the vertical direction (represented by the vertical reference line A shown in FIG. 1B), and a second angle $\alpha_2$ between the second sidewall 103$_2$ and the vertical direction. According to one embodiment, the first and the second angles $\alpha_1$, $\alpha_2$ have different signs, but substantially the same absolute values. It is, however, also possible, that the two angles $\alpha_1$, $\alpha_2$ have different absolute values, or that only one of the sidewalls, e.g. the first sidewall 103$_1$, is beveled relative to the vertical reference line A, while the other sidewall, e.g. the second sidewall 103$_2$, is a vertical sidewall, meaning that an angle between that sidewall and the reference line A (e.g. angle $\alpha_2$) is substantially 0°.

In a horizontal plane of the semiconductor body 100, which is a plane perpendicular to the vertical section plane shown in FIGS. 1A-1C, the trench 210 forms a closed loop. That is, the trench 210 is ring-shaped in this horizontal plane. The exact form of the ring may vary. Two different embodiments are shown in FIGS. 3 and 4.

Figure 3:
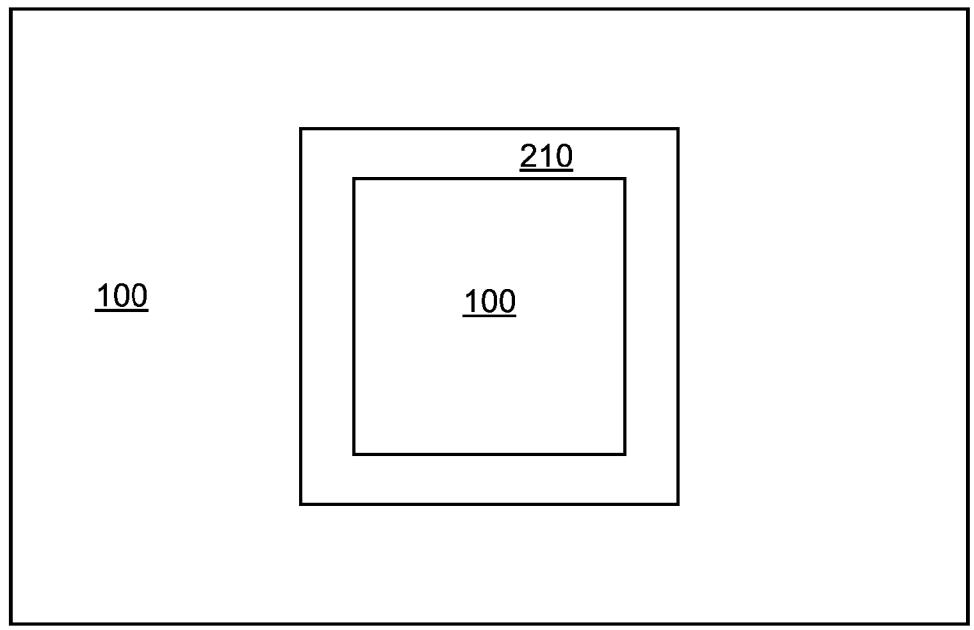
FIG. 3 illustrates a top view of a semiconductor body having a trench with a substantially rectangular shape.
Figure 4:
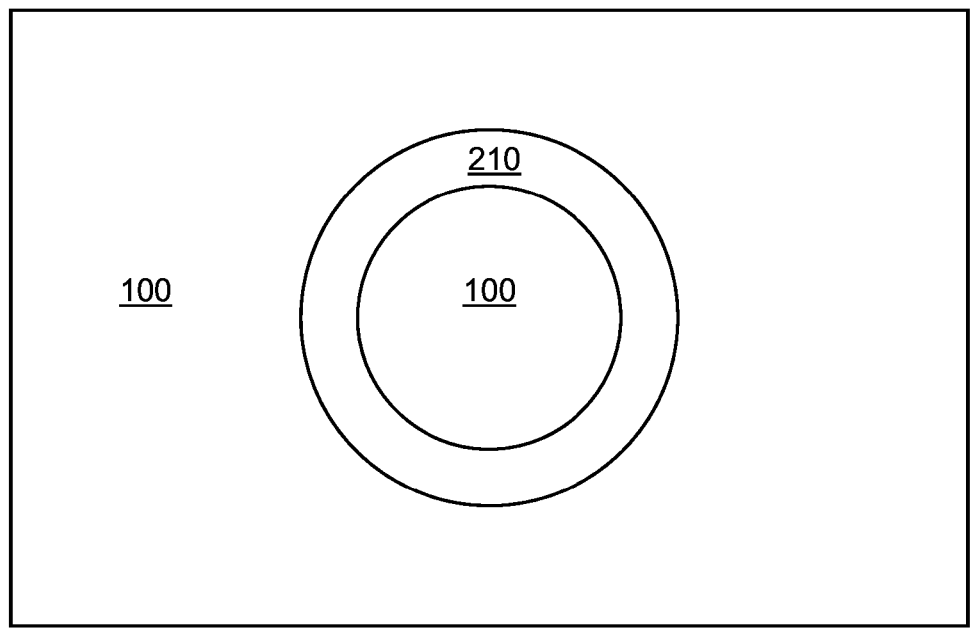
FIG. 4 illustrates a top view of a semiconductor body having a trench with a substantially circular shape.

FIGS. 3 and 4 each show a top view of the semiconductor body 100 after forming the trench. Referring to FIG. 3, the trench 210 can be implemented to form of a substantially rectangular (in particular, square) ring, wherein the corners may not be rounded (as illustrated), or may be rounded (not illustrated). Referring to FIG. 4, the trench 210 can be implemented to form of a substantially elliptical (in particular, circular) ring. However, other forms such as a polygonal ring are possible as well. In particular, structures that do not have the form of a circular ring cannot be realized by other methods like e.g. mechanical beveling. A free selection of the angles along the closed loop is not possible by conventional methods.

Referring to FIG. 1C, after forming the trench 210, semiconductor material of the semiconductor body 100 between the second surface 102 and the trench 210 is removed, in order to separate a region 400 of the semiconductor body 100 surrounded by the trench 210 from other regions of the semiconductor body 100. This region 400 of the semiconductor body 100 separated from other regions will be referred to as die or semiconductor device in the following. Removing the semiconductor material between the second surface 102 and the trench may include at least one abrasion method, such as a chemical and/or a mechanical abrasion method. A suitable abrasion method is, for example, a CMP (Chemical Mechanical Polishing) method, or an etching method.

Referring to FIG. 1B, the sidewalls 103$_1$, 103$_2$ of the trench 210 can be beveled relative to a vertical direction of the semiconductor body 100 such that the first and second angles $\alpha_1$, $\alpha_2$ of the first and second sidewalls, respectively, have different signs, but substantially the same absolute value. However, it is also possible to form the trench 210 such that the first and second angles $\alpha_1$, $\alpha_2$ have the same sign and have substantially the same value. This is explained with reference to FIGS. 2A-2C.

Figure 2A:
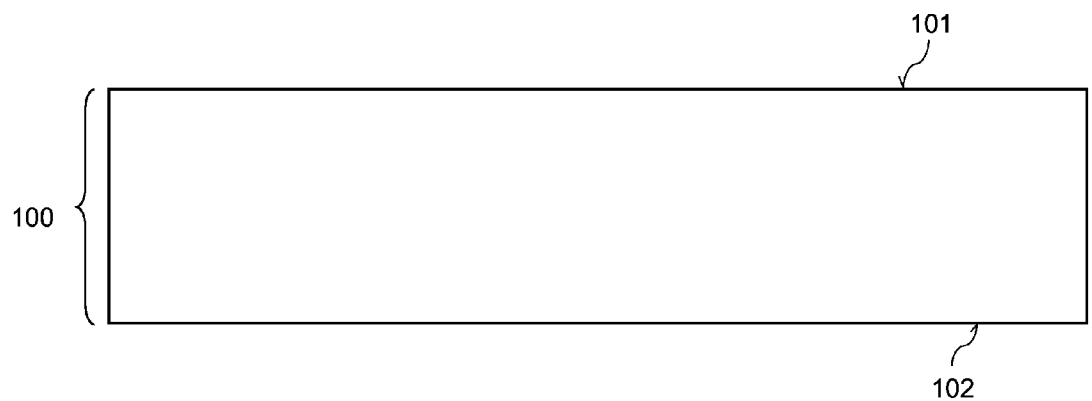
FIGS. 2A-2C, illustrates vertical cross-sectional views of a semiconductor body for illustrating another embodiment of a method for producing a semiconductor device.
Figure 2B:
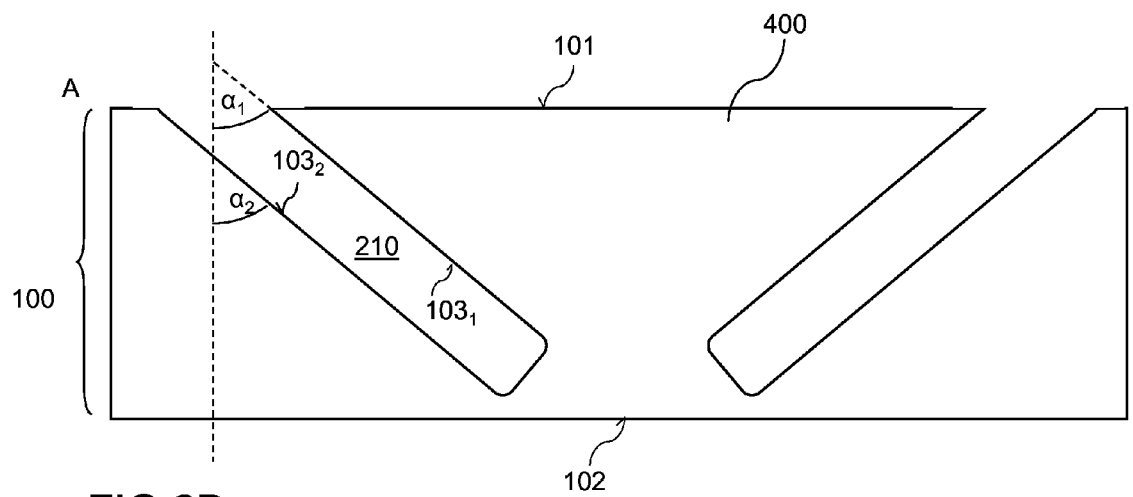
Figure 2C:
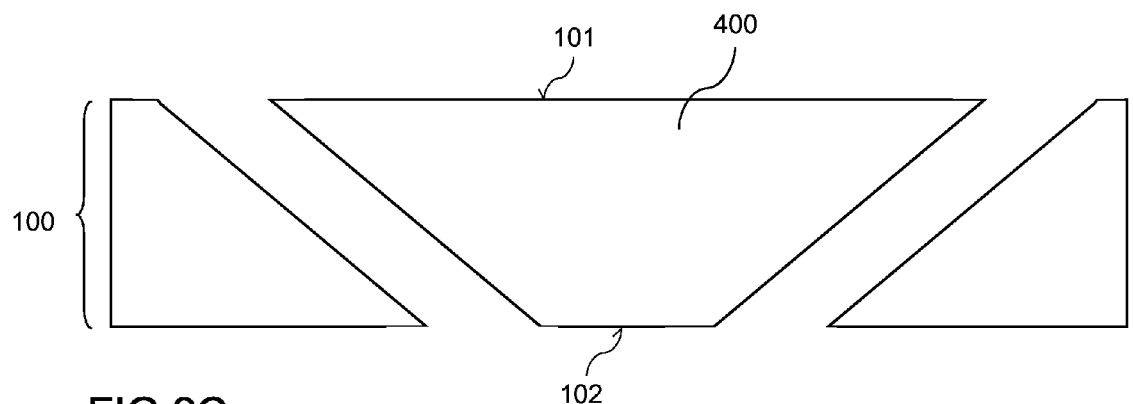

FIG. 2A shows a vertical cross sectional view of the semiconductor body 100 before forming the trench. FIG. 2B shows a vertical cross sectional view of the semiconductor body 100 after forming the trench 210. The trench 210 has a first sidewall 103$_1$, and a second sidewall 103$_2$ opposite the first sidewall. These first and second sidewalls 103$_1$, 103$_2$ are beveled relative to the vertical direction of the semiconductor body 100. In FIG. 2B, $\alpha_1$ denotes a first angle between the first sidewall 103$_1$ and the vertical direction, and $\alpha_2$ denotes a second angle between the second sidewall 103$_2$ and the vertical direction. In the present embodiment, these first and second angles $\alpha_1$, $\alpha_2$ have the same sign and have substantially the same value. Like the trench 210 explained with reference to FIG. 1B, the trench 210 shown in FIG. 2B may form a closed loop as explained with reference to FIGS. 3 and 4 herein above.

Referring to FIG. 1C, after forming the trench 220, the semiconductor material between the second surface 102 and the trench 210 is removed in order to separate the semiconductor region 400 surrounded by the trench 210 from other semiconductor regions of the semiconductor body 100. Any one of the methods explained with reference to FIG. 1C can be used to remove the semiconductor material.

Two different embodiments of methods for forming the trench 210 are explained with reference to FIGS. 5A-5G and 6A-6G below. Each of these figures show vertical cross sectional views of the semiconductor body 100 during (after) individual method steps.

Figure 5A:
FIGS. 5A-5G, illustrates vertical cross-sectional views of a semiconductor body for illustrating one embodiment of a method for forming a trench in a semiconductor device.
Figure 5B:
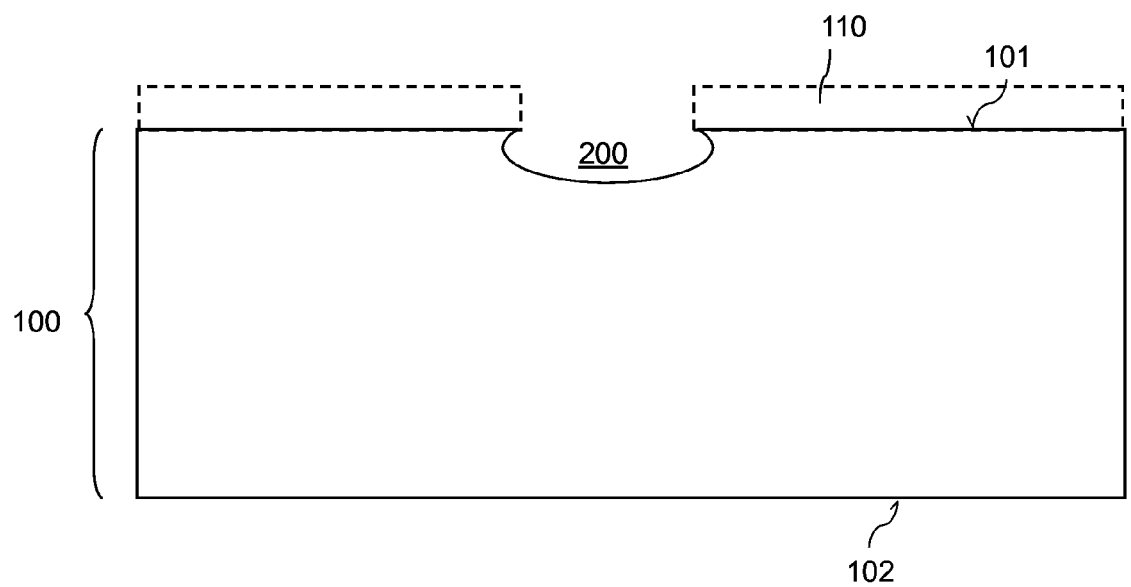
Figure 5C:
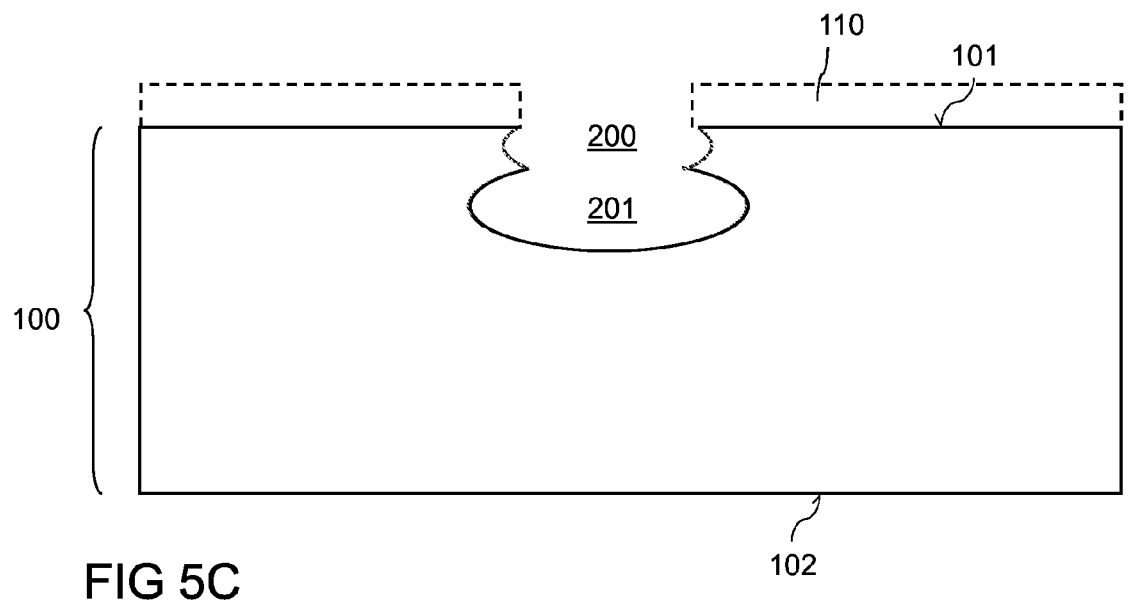

FIG. 5A shows the semiconductor body 100 before forming the trench 210. Referring to FIGS. 5B-5C the method includes forming the trench 210 (see FIG. 5D) by forming a plurality of sub-trenches (voids) 200-203 each having a trench depth lower than a depth of the final trench 210. Forming each of these sub-trenches may include a DRIE (Deep Reactive-Ion Etching) method. A DRIE process is an etch process that can be used to create deep penetration, steepsided holes and trenches in wafers or substrates, typically with high aspect ratios. There are two main DRIE processes, namely the cryogenic process and the Bosch process.

It is commonly known that the Bosch process includes a sequence of etching steps each including two process phases, namely a first phase in which a substantially isotropic plasma etching process is performed in order to form a trench (void), and a second phase in which a passivation layer is deposited on a bottom and sidewalls of the trench. In each first phase that follows a second phase, the passivation layer on the bottom of the trench is removed faster than the passivation layer on the sidewalls, so that mainly semiconductor material at the bottom of the trench is etched. For etching silicon, (Si) sulfur hexafluoride ($SF_6$) may be used as an etchant in the first phase, and octafluorocyclobutane ($C_4F_8$) source gas may be used to form the passivation layer in the second phase.

For the purpose of explanation, it is assumed that the Bosch process is employed to form the trench 210 including the plurality of sub-trenches 200-203. Referring to FIG. 5B, a first sub-trench 200 is formed in the first surface 101 in one first phase of the process. By virtue of the isotropic nature of the plasma etching process, the sub-trench 200 may have a substantially elliptical cross section. The etching process includes forming an etch mask 110 (illustrated in dashed lines in FIG. 5B) on the first surface 101, wherein those sections of the first surface 101 uncovered by the etch mask 110 are etched. After the first phase, the surface (the bottom and sidewalls) of the sub-trench 200 are passivated. However, a passivation layer is not illustrated in FIG. 5B.

Referring to FIG. 5C, a second sub-trench 201 is formed that substantially extends into the semiconductor body 100 from the bottom of the first sub-trench. This is because the plasma etching process also etches the passivation layer, and etches the passivation layer on horizontal surfaces, that is on the bottom of the first sub-trench 200, faster than on sidewalls. The second sub-trench 201, like the first sub-trench 201, has a substantially elliptical cross section. After forming the second sub-trench 201 the surfaces of the second sub-trench 201 (and of the first sub-trench 200) are passivated.

Figure 5D:
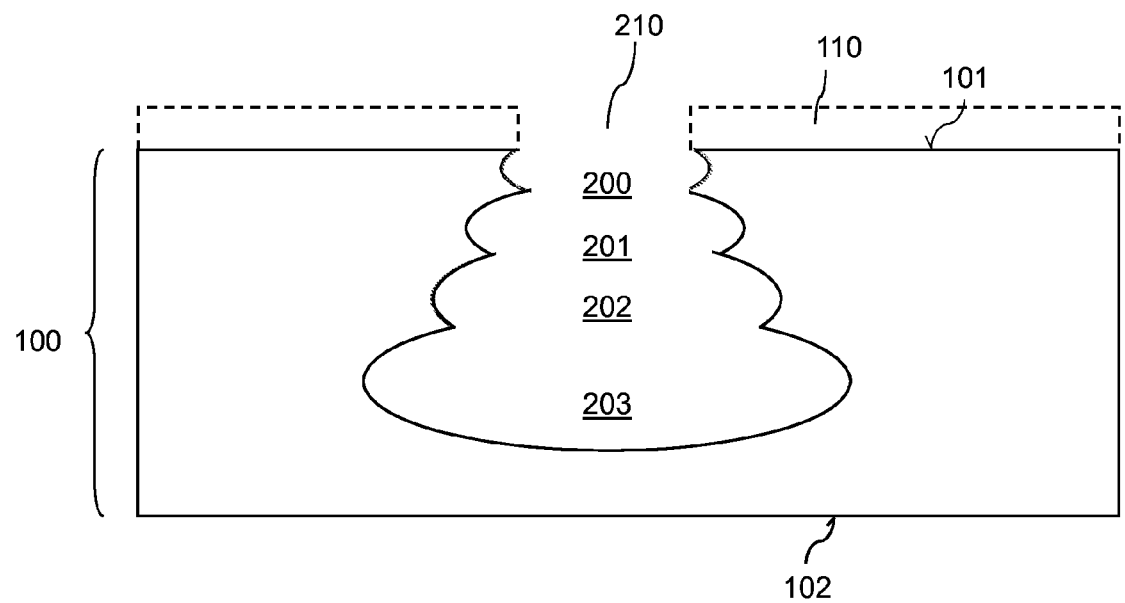

Each plasma etching process for etching one sub-trench, such as the sub-trenches 200, 201 shown in FIG. 5C, may take several seconds. According to one embodiment, the duration of the etching process increases from one etching process to a subsequent etching process, so that each sub-trench becomes deeper and wider than the sub-trenches formed before. FIG. 5D shows the semiconductor body 100 after four etching process so that four sub-trenches 200-203 were formed. However, the number of subsequent etching process and, therefore, the number of sub-trenches may vary and not limited to four.

Referring to FIG. 5D, the trench 210 formed by the sub-trenches 200-203 widens towards its bottom. That is, the trench 210 has substantially beveled sidewalls. This is by virtue of each sub-trench 201-203 being wider than the sub-trench(es) formed before.

Figure 5E:
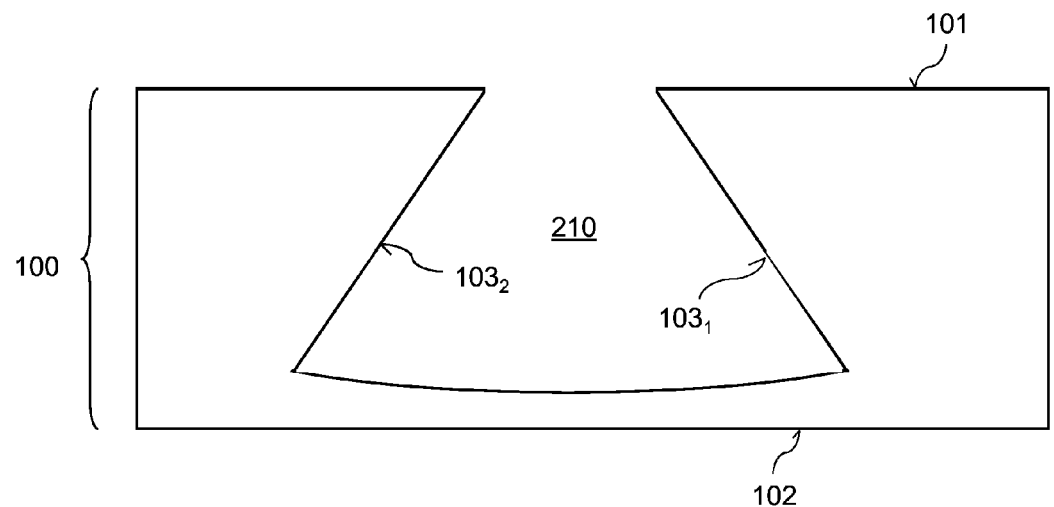

After forming the individual sub-trenches 200-203, the sidewalls of the trench 210 may have an uneven (rough) surface. Thus, according to one embodiment, the sidewalls are planarized. This may include tempering the semiconductor body 100 in a pure hydrogen atmosphere at temperatures of more than about 1000° C. at a pressure which can be atmospheric or lower. Instead of a pure hydrogen atmosphere, an atmosphere including a gas mixture of hydrogen and inert gases can be used. In this process, silicon along the sidewalls rearranges such that the sidewalls obtain a smooth surface. Referring to FIG. 5E, performing such a tempering step results in a trench 210 having smooth first and second sidewalls $103_1$, $103_2$.

The tempering step may also include or may be followed by forming a passivation layer on the sidewalls. Such passivation layer may, for example, include a thermally grown silicon dioxide ($SiO_2$), or silicon nitride ($Si_3N_4$) deposited in a low-pressure chemical vapor deposition (LP-CVD) process. During or shortly after the tempering step forming the passivation may be carried out at relatively high temperatures. This results in higher breakdown field strength, improved boundary surfaces and improved dielectric characteristics of the semiconductor material, for example.

Figure 5F:
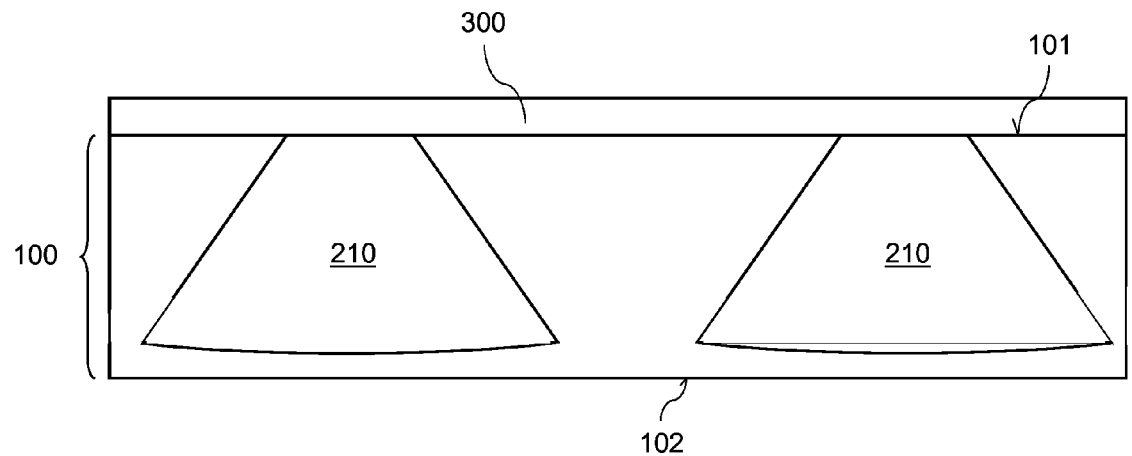

Referring to FIG. 5F, before removing semiconductor material between the second surface 102 and the trench 210, the semiconductor body 100 may be placed on a carrier 300 that faces the first surface 101. This may ease handling the die 400 obtained by removing the semiconductor material between the second surface 102 and the trench 210. Referring to the explanation above, the trench 210 may form a closed loop. While FIGS. 5B-5E only show a cross section of a part of a ring-shaped trench, FIG. 5F shows a cross section of a ring-shaped trench. According to one embodiment, a plurality of ring-shaped trenches is formed in the semiconductor body 100 so as to obtain a plurality of dies 400. In this case, FIG. 5F only shows a section of the semiconductor body 100.

Figure 5G:
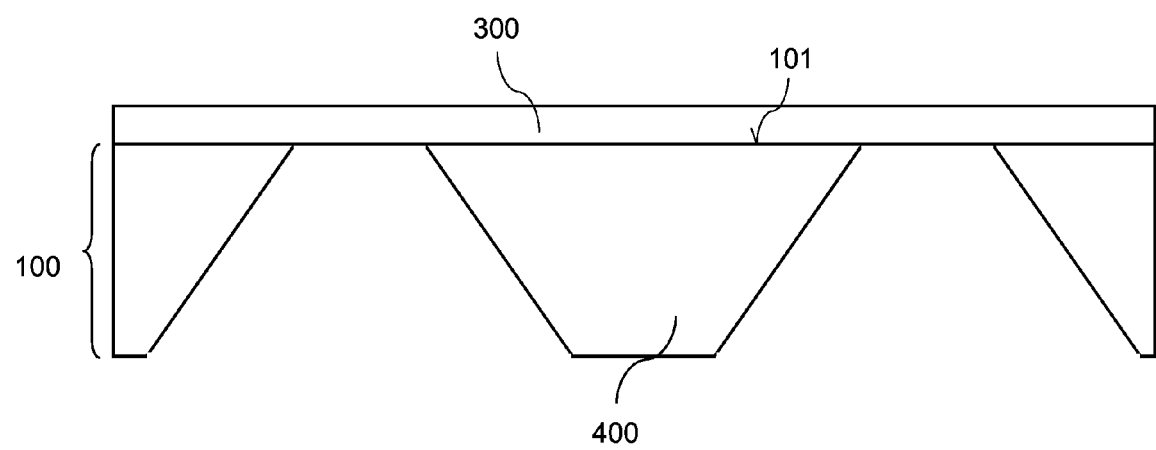

Referring to FIG. 5G, the semiconductor material between the second surface 102 and the trench 210 is removed. This may include one of the aforementioned methods. After removing the semiconductor material between the second surface 102 and the trench 210, the die 400 is still mounted to the carrier 300. In case several trenches are formed in the semiconductor body 100, removing the semiconductor material between the second surface 102 and the trench 210 causes a singularization of the individual dies 400, wherein each die is defined by one ring-shaped trench. According to one embodiment, the plurality of ring-shaped or square-shaped (with or without rounded corners) trenches form (are part of) a grid-shaped trench arrangement that defines a plurality of dies.

FIGS. 6A-6G illustrate a further embodiment of a process for producing a trench 210 with beveled sidewalls. This process is based on the so-called Venezia-process. FIG. 6A-6G each show a vertical cross sectional view of the semiconductor body 100 during (after) individual method steps.

Figure 6A:
FIGS. 6A-6F, illustrates vertical cross-sectional views of a semiconductor body for illustrating one embodiment of a method for forming a trench in a semiconductor device.
Figure 6B:
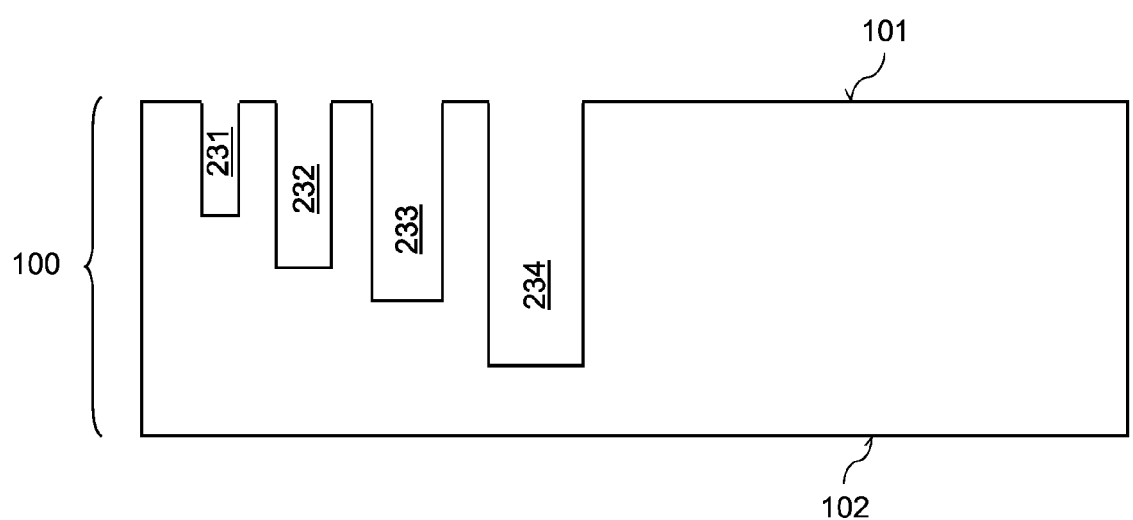

FIG. 6A shows the semiconductor body 100 before forming the trench 210. FIG. 6B shows the semiconductor body after forming a plurality of trenches 231-234. Each of these trenches 231, 232, 233, 234 extends from the first surface 101 in a substantially vertical direction into the semiconductor body 100. The individual trenches 231-234 may have different trench depths such that, when proceeding in a horizontal direction of the semiconductor body 100 from a first trench 213 of the series of trenches to a last trench 234 of the series of trenches, the trench depth increases. That is, each of the second to last trenches 232-234 may be deeper than the preceding trench. That is, in the embodiment shown in FIG. 6B, each trench that has a trench to its left (i.e., trenches 232-234) is deeper than this trench to the left. However, it is also possible that two neighboring trenches have substantially the same depths, but at least the last trench 234 is deeper than the first trench 231. Further, a width of the trenches 231, 232, 233, 234 may increase from the first trench 231 to the distant trench 234 (FIG. 6B). This may allow etching of the individual trenches 231-234 in one etching process, because the depth of the etched trenches depends on the width of the trenches. That is, a wider trench is etched deeper in a predefined etching time than a narrower trench.

The trenches 231-234 can be formed using a conventional etching process using an etch mask (not shown) such as an anisotropic etching process. In FIG. 6B, four trenches are shown. However, this is only an example. The number of trenches may vary and is not restricted to four.

Figure 6C:
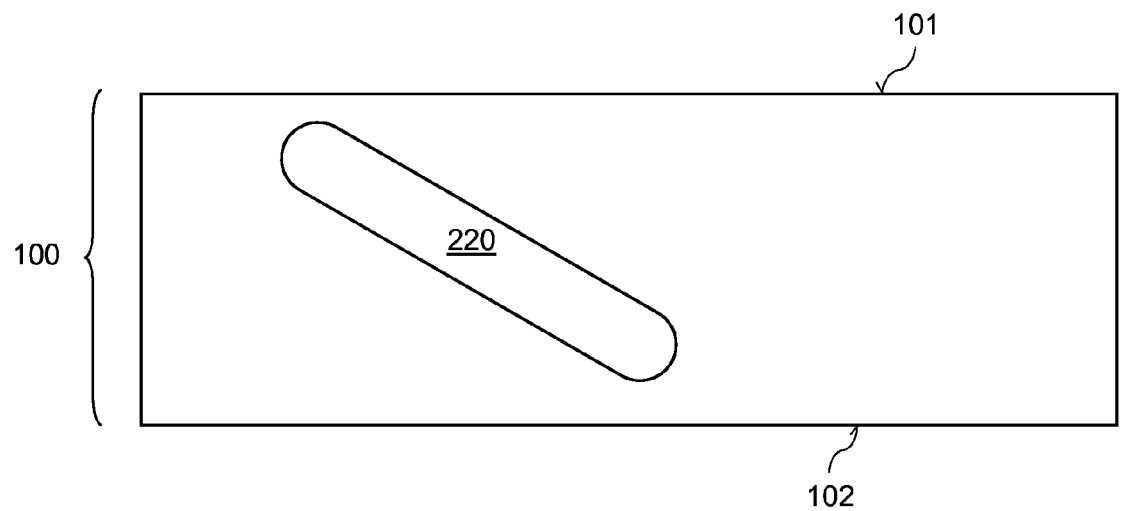

Referring to FIG. 6C, a void 220 is formed from the series of trenches 231-234. This may include a tempering process in a pure hydrogen atmosphere at relatively high temperatures, such as temperatures above 1000° C. at a pressure which can be atmospheric or lower. Instead of a pure hydrogen atmosphere, an atmosphere including a gas mixture of hydrogen and inert gases can be used. In this process, mesa regions between the individual trenches 231-234 are removed, and the void 220 is formed. According to one embodiment, a width of the trenches 231-234 is between 100 nm and 5 µm and a mesa between each two of the trenches is not wider than the mean width of the two neighboring trenches (the two trenches adjoining the mesa region). According to a further embodiment, the mesa region between two trenches is smaller than 70% or smaller than 50% of the mean width of the two neighboring trenches. The void has smooth first and second sidewalls that are beveled relative to the vertical direction of the semiconductor body 100.

The tempering step may also include or be followed by forming a passivation layer on the sidewalls. Such passivation layer may, for example, include a thermally grown silicon dioxide ($SiO_2$), or silicon nitride ($Si_3N_4$) deposited in a low-pressure chemical vapor deposition (LPCVD) process. During or shortly after the tempering step, forming the passivation may be carried out at relatively high temperatures. This results in higher breakdown field strength, improved boundary surfaces and improved dielectric characteristics of the semiconductor material, for example.

Figure 6D:
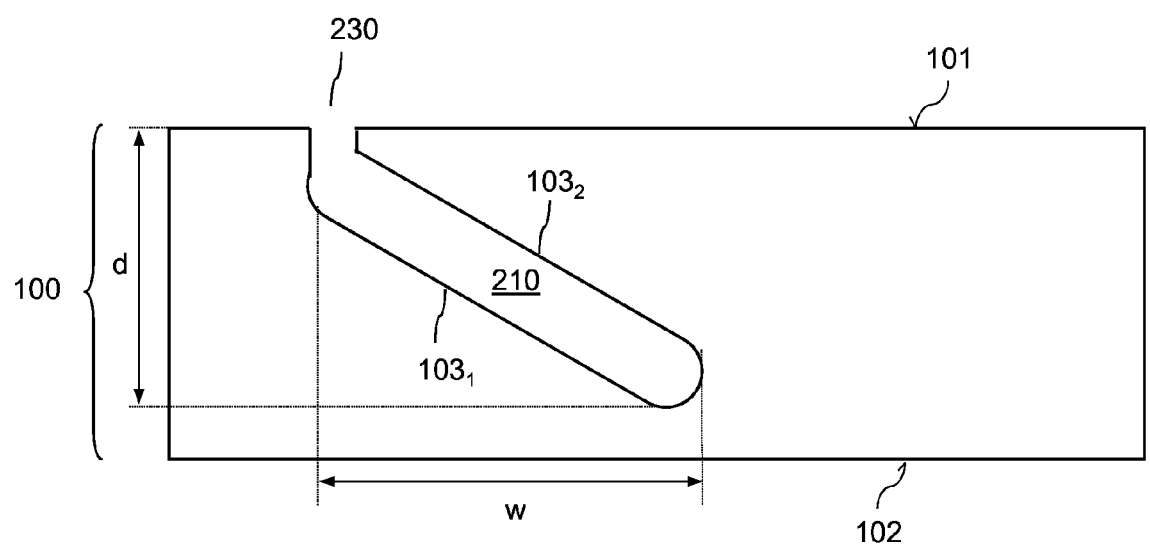

Referring to FIG. 6D, an opening 230 is formed that extends from the first surface 101 to the void so as to form the trench 210. The trench has first and second sidewalls $103_1$, $103_2$ that are beveled relative to the vertical direction of the semiconductor body 100, and that can be substantially parallel. Referring to FIG. 6D, the trench 210 has a depth d, which is the distance between the first surface 101 and a position of the trench 210 that is most distant to the first surface, and a width w. The depth d is dependent on the depth of the deepest trench formed before, wherein the depth d is the deeper the deeper the deepest trench is. In the embodiment shown in FIG. 6B, trench 234 is the deepest trench. The width w of the trench 210 is dependent on the number of trenches 231-234, the width of these trenches 231-234, and their mutual distance. The width increases as one of these parameters (number, width, distance) increases. The bevel of the sidewalls $103_1$, $103_2$ can be adjusted through the depth d and the width w.

Alternatively to producing the opening 230 in order to open the void 220 and thereby form the trench 210, the void 220 may be opened by using an abrasion technique that removes the semiconductor material between the first surface 101 and the void 220. A suitable abrasion method is, for example, a CMP (Chemical Mechanical Polishing) method, or an etching method.

Figure 6E:
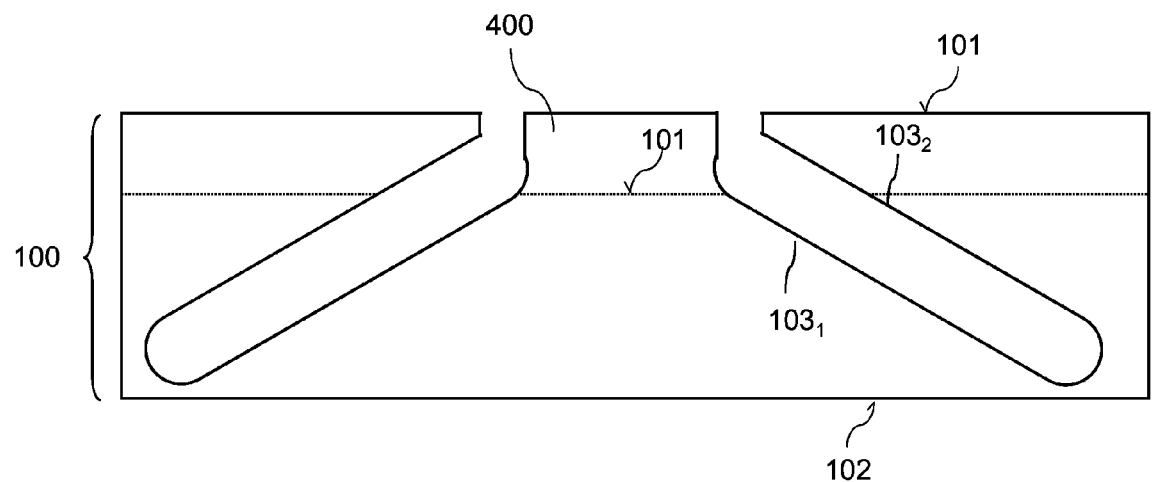

Like the aforementioned trenches, the trench 210 shown in FIG. 6D may form a closed loop. While FIGS. 6B-6D only show a cross section of a part of a ring-shaped trench, FIG. 6E shows a cross section of a ring-shaped trench defining a die 400. According to one embodiment, a plurality of ring-shaped trenches are formed in the semiconductor body 100 so as to obtain a plurality of dies 400. In this case, FIG. 6E only shows a section of the semiconductor body 100.

Figure 7:
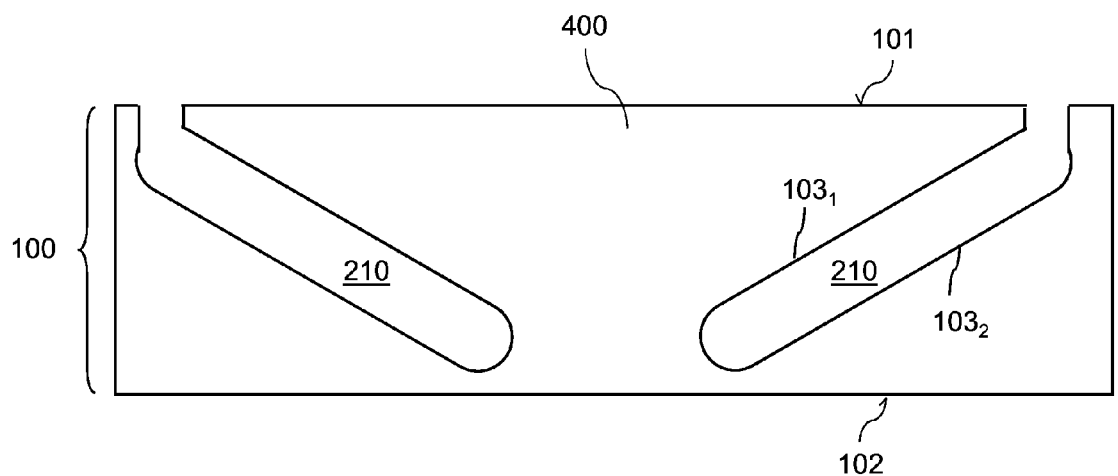
FIG. 7 illustrates a vertical cross sectional view of a semiconductor body obtained through a modification of the method shown in FIGS. 6A-6F.

In the embodiment shown in FIG. 6E, the first sidewall $103_1$ of the trench 210 defines the die 400 that is obtained by removing the semiconductor material between the second surface 102 and the trench 210 in a later step. In this embodiment, the first sidewall $103_1$ of the trench 210 is beveled such that the die narrows towards the first surface 101 of the semiconductor body 100. However, this is only an example. Referring to FIG. 7 it is also possible to bevel the first sidewall $103_1$ such that the die 400 widens towards the first surface 101.

Whether the die is formed such that it widens towards the second surface 102 (as shown in FIG. 7), or narrows towards the second surface 102 (as shown in FIG. 6E) is dependent on the type of semiconductor device that is integrated in the die. This is explained in further detail below.

Referring to FIG. 6E, there may be a section of the semiconductor body 100 that has substantially vertical sidewalls between two opposing trench sections. This section can be removed by planarizing the semiconductor body 100 in the region of the first surface before dividing the semiconductor body. Alternatively, a planarizing technique, such as a chemical and/or mechanical polishing technique, is used to "open" the void 220 in the region of the first surface. In this case, the complete semiconductor layer between the first surface 101 and an upper end of the void 220 is removed, so that the forming of the section with the substantially vertical sidewalls is prevented. The dotted line shown in FIG. 6E, represents the first surface 101 after such planarizing process.

Figure 6F:
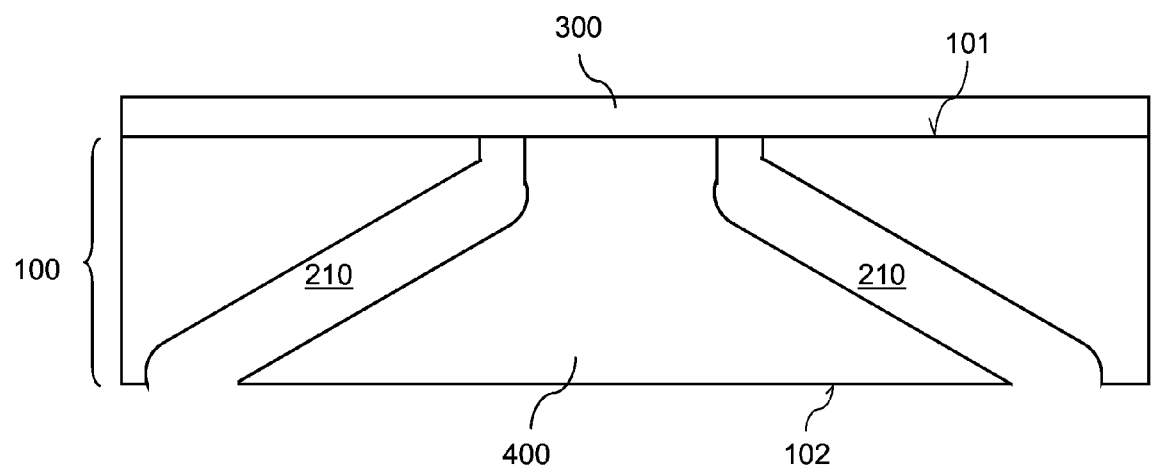

Referring to FIG. 6F, before removing the semiconductor material between the second surface 102 and the trench 220, the semiconductor body 100 may be mounted to a carrier 300, with the carrier facing the first surface 101. This may ease handling the die 400 obtained by removing the semiconductor material between the second surface 102 and the trench 210. The semiconductor material between the second surface 102 and the trench 220 is then removed, in order to obtain the die 400, isolated from the rest of the semiconductor body 100. Removing the semiconductor material may include one of the aforementioned methods.

In the aforementioned embodiments, the semiconductor material between the second surface 102 and the at least one trench 210 is removed such that semiconductor material is removed all over the second surface 102 down to the trench 210. That is, the complete semiconductor layer between the second surface and the at least one trench is removed. However, this removal process is optional. It is also possible to divide the semiconductor body 100 by conventional cutting techniques, such as sawing, laser cutting, water cutting (waterjet cutting), or trench etching, in particular plasma etching. In this case, a sawing tool cuts from the second surface 102 through the semiconductor body 100 to the bottom of the trench 210, or a trench is etched from the second surface 102 to the bottom of the trench 210. Optionally, a semiconductor layer thinner than the layer between the second surface and the trench 210 is removed before the cutting process.

Figure 8:
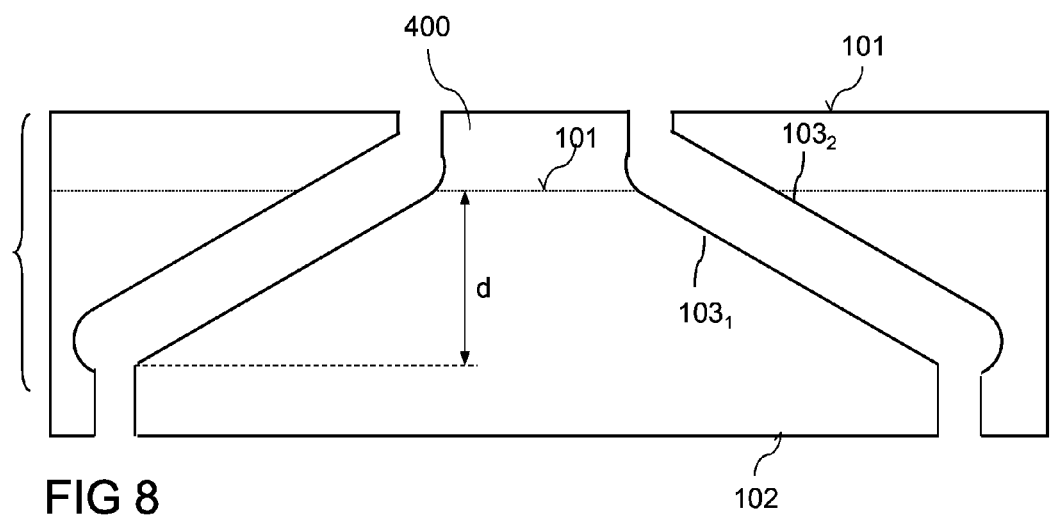
FIG. 8 illustrates a vertical cross sectional view of a semiconductor body obtained through a further modification of the method shown in FIGS. 6A-6F.

FIG. 8 shows a vertical cross sectional view of a die that is obtained by cutting or etching from the second surface 102 to the trench 210. This die has a section with beveled sidewalls, which is the section surrounded by the beveled trench 210, and at least one section with vertical sidewalls, namely a section between the trench 210 and the second surface 102.

Figure 9:
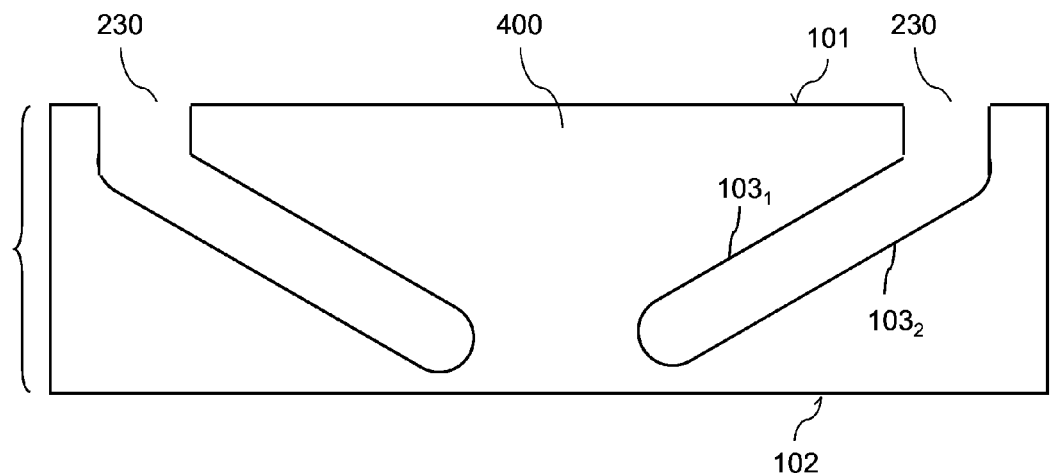
FIG. 9 illustrates a vertical cross sectional view of a semiconductor body obtained through yet another modification of the method shown in FIGS. 6A-6F.

A die 400 in which only a section of the edge surface is beveled, while another section is substantially vertical may also be obtained using the method shown in FIGS. 6A-6F when the void 220 is formed more distant to the first surface 101 and/or when a relatively broad opening 230 is formed. A die 400 (before the singularization) obtained through this modification is shown in FIG. 9.

In each of the aforementioned embodiments, the trench 210 extends in a vertical direction from the first surface 101 into the semiconductor body 100. A depth d (see, for example, FIG. 8) of the trench 210, which is the dimension of the trench 210 in the vertical direction of the semiconductor body 100, may depend on the type of semiconductor device that will be integrated in the semiconductor body 100. Semiconductor devices, in particular vertical semiconductor devices, include a semiconductor layer in which active device regions are integrated, and a substrate. For example, in case of a MOSFET, the active regions include source, body, drift, drain regions. The substrate may serve as a mechanical carrier and/or as a conductor for carrying a current in a vertical direction. That is, in case of a MOSFET, the substrate may at least partially form the drain region. The depth d of the trench 210 may be between 50% and 200% of the thickness of the layer in which the active device regions are integrated.

If the depth of the trench 210 is less than 100% of the layer in which the active regions are integrated, the semiconductor body 100 may be separated using one of the techniques explained with reference to FIG. 8. In this case, the layer in which the active regions are integrated extends into that section of the die 400 that has the substantially vertical sidewalls and is arranged between the trench 210 and the second surface 102.

Two different methods for forming a trench 210 with sidewalls $103_1$, $103_2$ beveled relative to a vertical direction of the semiconductor body 100 have been explained with reference to FIGS. 5A-5G, 6A-6F, and 7-9. However, these methods are only examples. Any other suitable method may be used to form the trench 210 with beveled sidewalls.

The die 400 with the beveled sidewalls obtained by one of the aforementioned methods may include active device regions of a semiconductor device, such as a vertical power semiconductor device. However, these active device regions are not shown in FIGS. 1-9. These device regions may be formed by implantation and/or diffusion processes before forming the trench 210, between the method steps that form the trench 210, or after forming the trench 210 and before separating the die 400 from other regions of the semiconductor body 100. For example, the power semiconductor device includes a diode, a transistor such as a MOSFET or an IGBT, a thyristor, or the like.

Figure 10:
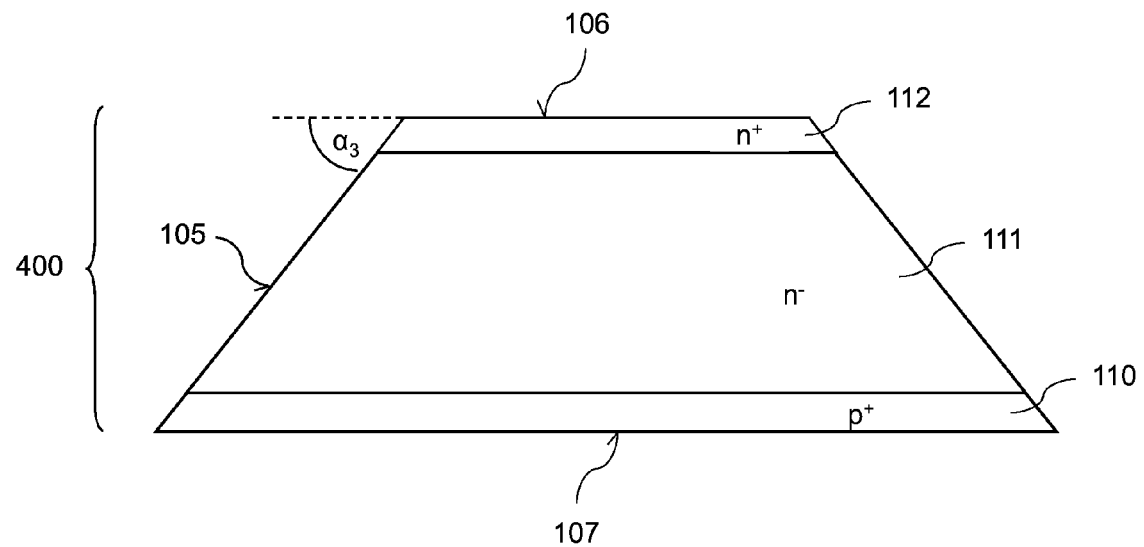
FIG. 10 illustrates a vertical cross sectional view of a semiconductor device having a positively beveled edge termination.

A die 400 including active device regions of a diode (a power diode) is explained with reference to FIG. 10 in the following. Referring to FIG. 10, the die 400 has a first surface 106, a second surface 107 opposite the first surface 106, and an edge surface 105. The edge surface 105 is beveled relative to a vertical direction of the die 400, wherein the vertical direction is perpendicular to the first and second surfaces 106, 107. Consequently, the edge surface 105 is beveled relative to the first and second surfaces 106, 107. In the embodiment shown in FIG. 11, $\alpha_3$ denotes an angle between the edge surface 105 and the first surface 103. This angle $\alpha_3$ corresponds to 90° minus the angle between the edge surface 105 and the vertical direction. $\alpha_3$ is dependent on the bevel of the first trench sidewall $103_1$. That is, $\alpha_3 = 90° - \alpha_1$, wherein $\alpha_1$, referring to FIGS. 1B and 2B is the angle between first sidewall $103_1$ and the vertical direction. $\alpha_1$ can be adjusted as explained herein. Typical values for the angle $\alpha_3$ are between 40° and 80°, for example. Other values are, however, also possible.

Referring to FIG. 10, the diode includes a drift region (base region) 111 of a first conductivity type (e.g. n-type), an anode region 110 of a second conductivity type (e.g. p-type) complementary to the first conductivity type. In the present embodiment, the anode region 110 is arranged between drift region 111 and the second surface 107 and forms a pn junction with the drift region 111. The diode 400 further includes a cathode region 112 of the first conductivity type, and more highly doped than the drift region 111. The cathode region 112 is arranged between the drift region 111 and the first surface 106.

The anode region 113 and the cathode region 112 may be formed at any stage during the production process of the semiconductor device 400. For example, these regions 112, 113 may be formed before the trench 210 is formed. This is, however only an example. These regions 112, 113 could also be formed after the semiconductor device 400 has been isolated from the semiconductor body 100. The anode region 113 and the cathode region 112 can be formed using at least one of an implantation and diffusion process.

Figure 11:
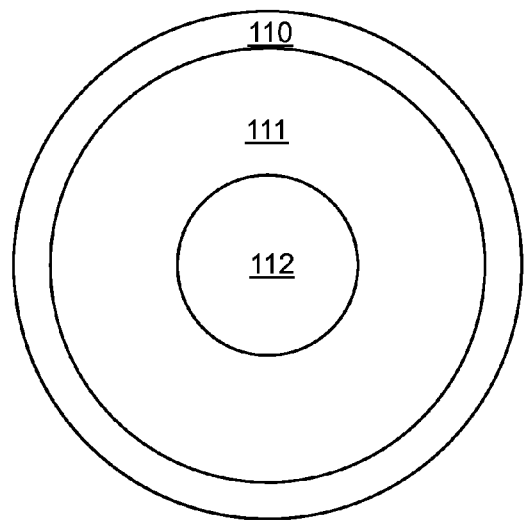
FIG. 11 illustrates a top view of a semiconductor device having a round semiconductor body with a beveled edge termination.
Figure 12:
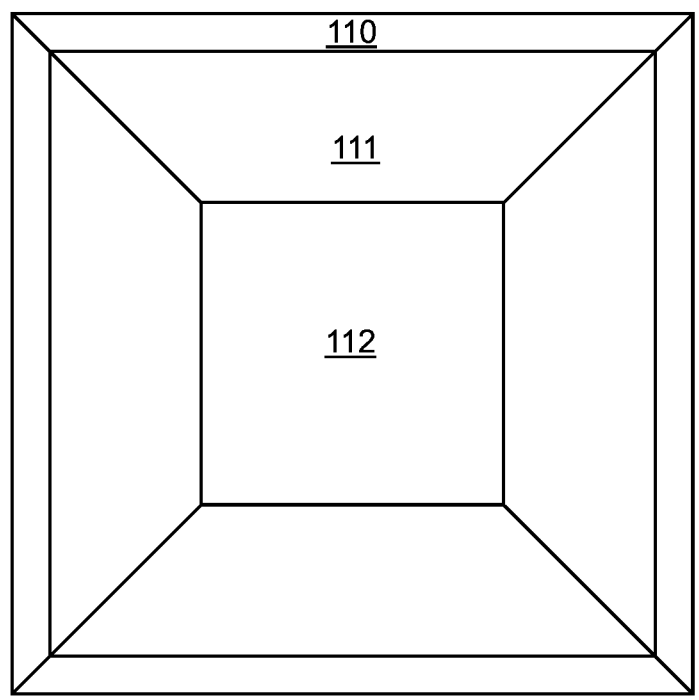
FIG. 12 illustrates a top view of a semiconductor device having a rectangular semiconductor body with a beveled edge termination.

The form of the die 400 in the horizontal plane depends on the form of the trench 210 that has been formed in the semiconductor body 100. For example, if the trench has the form of an elliptical (circular) ring the resulting semiconductor device 400 has a substantially elliptical (circular) geometry. FIG. 11 illustrates a top view of a semiconductor device 400 having a circular shape. For example, if the trench has the form of a rectangular (square) ring the resulting semiconductor device 400 has a substantially rectangular (square) geometry. FIG. 12 illustrates a top view of a semiconductor device 400 having a square shape. According to one embodiment, the corners of the square shaped semiconductor die 400 are rounded.

According to one embodiment, the second surface 107 of the die 400 corresponds to first surface 101 of the semiconductor body 100. In this case, the trenches 210 are formed such that the die 400 narrows towards the second surface 102, as shown in FIGS. 1C, 2C, 5G, and 7. According to another embodiment, the first surface 106 of the die 400 corresponds to first surface 101 of the semiconductor body 100. In this case, the trenches 210 are formed such that the die 400 widens towards the second surface 102, as shown in FIG. 6F.

Figure 13:
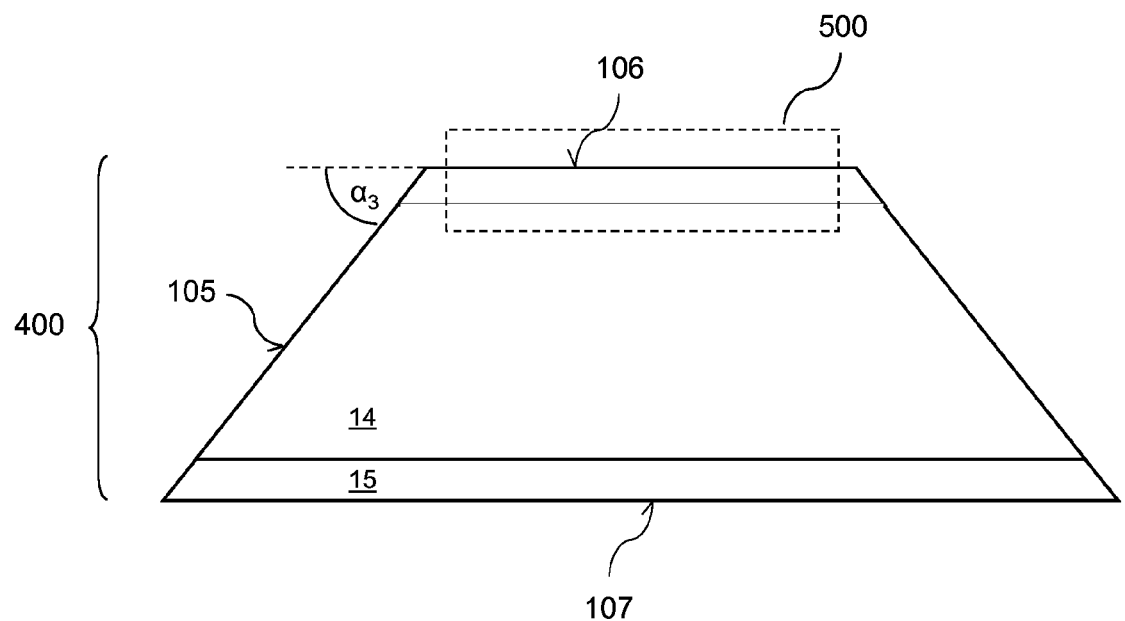
FIG. 13 illustrates a vertical cross sectional view of another semiconductor device having a positively beveled edge termination.
Figure 14:
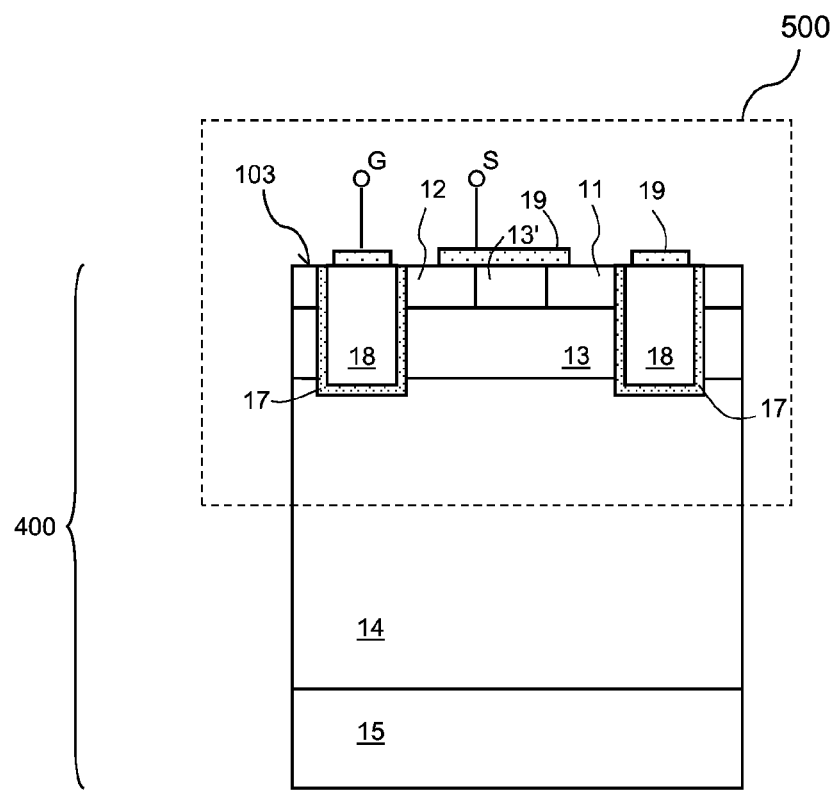
FIG. 14 illustrates a section of the semiconductor device shown FIG. 13 in greater detail.

FIG. 13 schematically illustrates a vertical cross-sectional view of a die 400 including active regions of a transistor device such as a MOSFET or IGBT. Referring to FIG. 13, the die 400 has a first surface 106, a second surface 107, and an edge surface 105. Like in the diode shown in FIG. 10, the edge surface 105 is beveled relative to the top surface 103, wherein $\alpha_3$ denotes the angle between the first surface 106 and the edge surface 105. The semiconductor device 400 includes a drift region 14 of a first conductivity type (e.g. n-type), and a drain region 15 arranged between the drift region 14 and the second surface 107. The drift region 14 may adjoin the drain region 15 as shown in FIG. 13. Optionally, a field stop region (not shown) of the first conductivity type and more highly doped than the drift region 14 may be arranged between the drift region 14 and the drain region 15. The transistor device can be implemented as a MOSFET or as an IGBT. In a MOSFET, the drain region 15 has the same conductivity type (doping type) as the drift region 14, but is more highly doped. In an IGBT, the drain region 15 has a conductivity type complementary the conductivity doping of the drift region 14 (in an IGBT, the drain region can be referred to as emitter region or collector region). The drain region 15 may be electrically connected to a drain electrode (not shown) arranged on the second surface 107 of the semiconductor device 400. The drain electrode may form a drain terminal (collector terminal in case of an IGBT) of the transistor device or is electrically connected to such drain terminal (not shown). Referring to FIG. 13, the transistor device further includes a cell region 500 with at least one transistor cell in the region of the first surface 106. One embodiment of the cell region 500 is schematically shown in FIG. 14. The section illustrated in FIG. 14 shows only two transistor cells. The overall number of transistor cells can be several ten thousand ($10^5$), several hundred thousand ($10^6$), or even more.

Like in the embodiment explained with reference to FIG. 10, the second surface 107 of the die 400 may correspond to the first surface 101 of the semiconductor body 100 in the process of producing the die 400 from the semiconductor body 100, or the first surface 106 of the die 400 may correspond to the first surface 101 of the semiconductor body 100.

Referring to FIG. 14, each transistor cell includes a body region 13 of the second conductivity type (e.g. p-type) complementary to the first type, and a source region 11 of the first conductivity type. The body region 13 separates the source region 11 from the drift region 14. The source and body regions 12, 13 are electrically coupled to a source electrode 19 that forms a source terminal S or is coupled to a source terminal S. Optionally, the source electrode 19 is connected to the body region 13 through a body contact region 13', which has the same conductivity type (e.g. p-type) as the body region 13, but is more highly doped than the body region 13.

Each transistor cell further includes a gate electrode 18 adjacent the body region 13 and dielectrically insulated from the body region 13 by a gate dielectric 17. In the embodiment shown in FIG. 14, the gate electrode is a trench electrode that is arranged in a trench extending from the first surface 106 into the semiconductor body 100. However, this is only an example. The gate electrode could also be implemented as a planar electrode above the first surface 106. The gate electrode 18 is capable of controlling a conducting channel in the body region 13 between the source region 12 and the drift region 14. The gate electrode 18 is electrically to a gate terminal G.

The individual transistor cells are connected in parallel by having the gate electrodes 18 connected to a common gate terminal G, and by having the source and body regions 12, 13 connected to a common source terminal S. Further, the individual transistor cells have the drift region 14 and the drain region (collector region) 15 in common. Referring to FIG. 14, two neighboring transistor cells may share one body region 13, and two (other) neighboring transistor cells may share one gate electrode 18.

The active device regions of the transistor device explained with reference to FIGS. 13 and 14 can be formed in the die 400 at any stage before or after obtaining the die 400 from the semiconductor body 100.

Instead of a diode or a transistor device any other power semiconductor device may formed in the die 400 as well.

Figure 15:
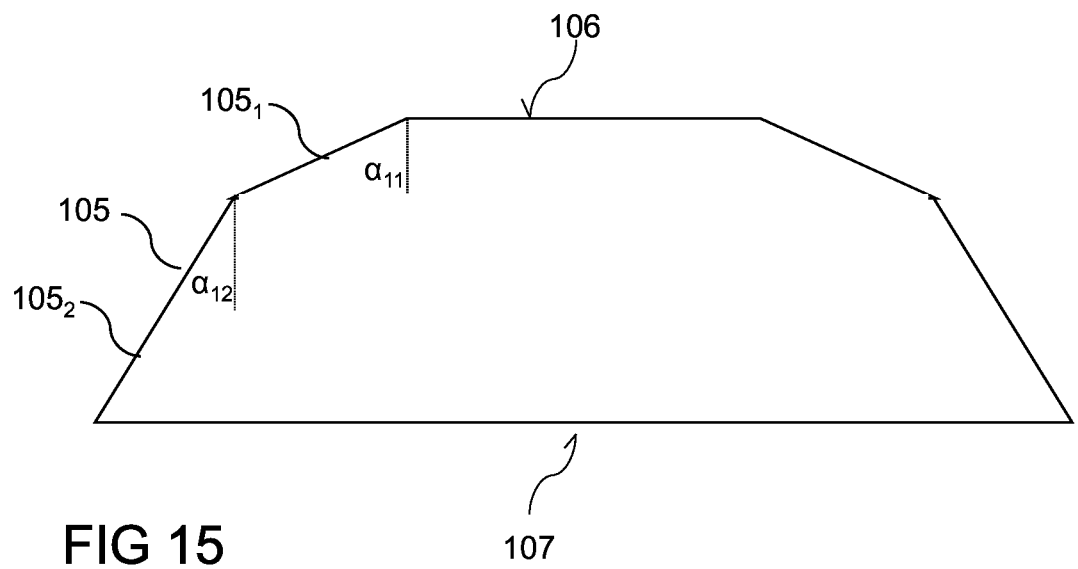
FIG. 15 illustrates a vertical cross sectional view of a semiconductor die having sidewalls with two differently beveled sidewall sections.

Referring to the explanation above, the bevel of sidewalls of a void 220 formed based on the Venezia process can be adjusted based on a distance of neighboring trenches, and based on a difference between trench depths of two neighboring trenches. In this context, it is even possible to form a trench that includes at least one sidewall with at least two differently beveled sidewall sections. A vertical cross sectional view of one embodiment of a die 400 that was produced using a trench with differently beveled sidewall sections is shown in FIG. 15. In this embodiment, sidewalls 105 of the die 400 have a first sidewall section $105_1$ adjoining the first surface 106, and a second sidewall section $105_2$ between the first sidewall section $105_1$ and the second surface 107. In this embodiment, a first angle $\alpha_1$ between the first sidewall section $105_1$ and the vertical direction is larger than a second angle $\alpha_2$ between the first sidewall section $105_1$ and the vertical direction.

Figure 16:
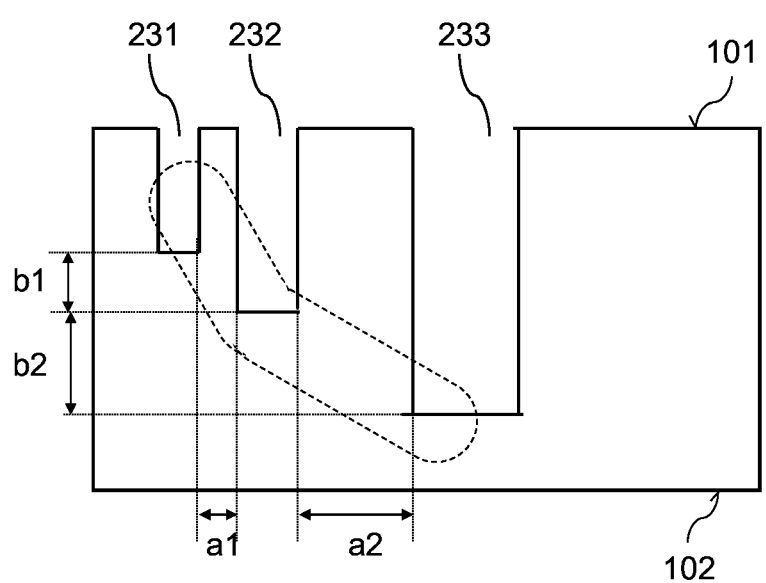
FIG. 16 illustrates a vertical cross sectional view of a semiconductor body during a method for forming a void with differently beveled sidewall sections.

The die 400 shown in FIG. 15 may be produced based on the Venezia process. FIG. 16 shows a vertical cross sectional view of the semiconductor body 100 after forming trenches in the first surface 101 of the semiconductor body 100 as part of this process. In this embodiment, there are three trenches, namely a first trench 231, a second trench 232, and a third trench 233 with different trench depths, and different mutual distance. In this embodiment, a mutual distance between the first and second trench 231, 232 is a1, a mutual distance between the second and third trench 231, 232 is a2, a difference between trench depths of the first and second trench 231, 232 is b1, and a difference between trench depths of the second and third trench 232, 233 is b2. In this embodiment, a2>a1 and b2>b1. In the following temperature process this results in a void that has sidewalls with differently beveled sidewall sections. This void is illustrated in dotted lines in FIG. 16.

FIGS. 6A-6E illustrate embodiments of methods for forming a void 210 with beveled sidewalls in semiconductor body 100. This void 210 may be used for forming a die 400 with beveled sidewalls, as illustrated in FIG. 6F. In this case, the semiconductor body 100 is subdivided, for example, by removing semiconductor material between the second surface 102 and the void 210.

However, a void 210 as illustrated in FIGS. 6C and 7, in particular a void with a ring-shape is not limited to be used in connection with forming a die with beveled sidewalls. It is even possible to use the void 210 to electrically insulate a semiconductor region enclosed by the ring-shaped void from semiconductor regions outside the ring-shaped void. The gas, such as the process gas used in the method step explained with reference to FIG. 6C, may be used as an gaseous insulator in the void 210. Alternatively, the void is partially or completely filled with a solid insulator, such as an oxide, a nitride, or the like. For this, the void may be opened, as illustrated in FIG. 6D, in order to form the insulator inside the void.

Spatially relative terms such as "under," "below," "lower," "over," "upper" and the like are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

Although present embodiments and its advantages have been described in detail, it should be understood that various changes, substitutions and alterations can be made herein without departing from the spirit and the scope of the invention as defined by the appended claims. With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for producing a semiconductor device, the method comprising:
    forming a trench that defines a closed loop in a semiconductor body and extends from a first surface into the semiconductor body, the trench having at least one sidewall that is beveled relative to a vertical direction of the semiconductor body such that the at least one sidewall forms an acute angle with the first surface of the semiconductor body; and
    removing material of the semiconductor body at least between a bottom of the trench and a second surface opposite the first surface of the semiconductor body,
    wherein forming the trench comprises a DRIE etching process with a plurality of timely subsequent etching steps, and
    tempering the semiconductor body in a hydrogen containing atmosphere.

2. The method of claim 1, wherein the removing comprises:
    reducing an overall thickness of the semiconductor body beginning at the second surface, opposite to the first surface, until a semiconductor material between the second surface and the trench is removed.

3. The method of claim 1, wherein the removing comprises:
    cutting from the second surface through the semiconductor body to the trench.

4. The method of claim 3, wherein the cutting comprises at least one of sawing, water cutting, laser cutting, and plasma etching.

5. The method of claim 1, wherein the removing comprises:
    forming a further trench that extends from the second surface to the trench.

6. The method of claim 1, wherein the closed loop has a form selected from one of:
    an elliptical ring;
    a substantially rectangular ring; and
    a polygonal ring.

7. The method of claim 1, wherein the trench has a first sidewall defining a first angle with the vertical direction, and a second sidewall defining a second angle with the vertical direction.

8. The method of claim 7,
    wherein at least one of the first angle, and the second angle varies along the closed loop.

9. The method of claim 7, wherein the first angle and the second angle have substantially the same absolute value and different signs.

10. The method of claim 1, wherein the trench has a substantially trapezoidal cross-section.

11. The method of claim 1,
    wherein at least one of the plurality of timely subsequent etching steps is longer than a preceding etching step.

12. The method of claim 1, wherein each etching step of the plurality of timely subsequent etching steps is longer than a preceding etching step.

13. The method of claim 12, wherein each etching step comprises:
    a plasma etch phase in which the semiconductor body is etched to form a sub-trench; and
    a passivation phase in which a passivation layer is formed on surfaces of the sub-trench.

14. A method for producing a semiconductor device, the method comprising:
    forming a trench that defines a closed loop in a semiconductor body and extends from a first surface into the semiconductor body, the trench having at least one sidewall that is beveled elative to a vertical direction of the semiconductor body; and
    removing material of the semiconductor body at least between a bottom of the trench and a second surface opposite the first surface of the semiconductor body,
    wherein forming the trench comprises:
        forming a series of pre-trenches arranged next to each other in a horizontal direction of the semiconductor body, each pre-trench extending in a vertical direction from the first surface into the semiconductor body.

15. The method of claim 14, wherein the pre-trenches are formed such that a depth of the individual pre-trenches increases from a first pre-trench, forming one end of the series of pre-trenches, to a last pre-trench, forming another end of the series of pre-trenches.

16. The method of claim 15, wherein forming the trench further comprises:
    tempering the semiconductor body in a hydrogen containing atmosphere so as to form a void in the semiconductor body.

17. The method of claim 16, further comprising:
    forming of an opening that extends from the first surface to the void.

18. The method of claim 17, further comprising:
    placing the semiconductor body on a carrier facing the first surface before the removing material of the semiconductor body.

19. A method for producing a semiconductor device with a beveled edge termination structure, the method comprising:
- forming a trench that defines a closed loop in a semiconductor body and extends from a first surface into the semiconductor body, the trench having at least one sidewall that is beveled relative to a vertical direction of the semiconductor body; and
- removing material of the semiconductor body at least between a bottom of the trench and a second surface opposite the first surface of the semiconductor body, thereby separating a region of the semiconductor body surrounded by the trench from other regions of the semiconductor body,
- wherein forming the trench comprises a DRIE etching process with a plurality of timely subsequent etching steps, and
- tempering the semiconductor body in a hydrogen containing atmosphere.

* * * * *

UNITED STATES PATENT AND TRADEMARK OFFICE
CERTIFICATE OF CORRECTION

PATENT NO.        : 9,496,337 B2
APPLICATION NO.   : 14/134318
DATED             : November 15, 2016
INVENTOR(S)       : Hans-Joachim Schulze et al.

Page 1 of 1

It is certified that error appears in the above-identified patent and that said Letters Patent is hereby corrected as shown below:

In the Claims

Column 14, Line 40 (Claim 14, Line 6), please change "elative" to -- relative --

Signed and Sealed this
Twenty-first Day of February, 2017

Michelle K. Lee
*Director of the United States Patent and Trademark Office*